United States Patent
Walsh et al.

(10) Patent No.: US 12,176,909 B2
(45) Date of Patent: Dec. 24, 2024

(54) NANO-POWER ARCHITECTURE ENHANCEMENTS

(71) Applicant: Cypress Semiconductor Corporation, San Jose, CA (US)

(72) Inventors: Paul Walsh, Cork (IE); Mark Healy, County Cork (IE)

(73) Assignee: Cypress Semiconductor Corporation, San Jose, CA (US)

(*) Notice: Subject to any disclaimer, the term of this patent is extended or adjusted under 35 U.S.C. 154(b) by 232 days.

(21) Appl. No.: 17/506,542

(22) Filed: Oct. 20, 2021

(65) Prior Publication Data
US 2023/0122233 A1   Apr. 20, 2023

(51) Int. Cl.
*G06F 3/044* (2006.01)
*H03K 17/96* (2006.01)
*H03M 1/06* (2006.01)

(52) U.S. Cl.
CPC .......... *H03M 1/0607* (2013.01); *G06F 3/044* (2013.01); *H03K 17/962* (2013.01)

(58) Field of Classification Search
CPC .............. G06F 3/044; H03K 17/962; H03K 2217/96071; H03M 1/0607; H03M 1/00; H03M 3/00; H03M 5/00; H03M 7/00; H03M 9/00; H03M 11/00; H03M 13/00; H03M 99/00
See application file for complete search history.

(56) References Cited

U.S. PATENT DOCUMENTS

| | | | |
|---|---|---|---|
| 2007/0013566 A1* | 1/2007 | Chuang | H03M 3/34 341/143 |
| 2019/0072597 A1* | 3/2019 | Walsh | G01R 27/2605 |
| 2019/0187829 A1* | 6/2019 | Frame | G06F 3/04166 |

* cited by examiner

*Primary Examiner* — Judy Nguyen
*Assistant Examiner* — Brent J Andrews

(57) ABSTRACT

Apparatuses and methods of capacitance-to-digital code conversion are described. One capacitance-to-digital converter (CDC) includes front-end circuitry, including a comparator. The CDC further includes a first capacitive digital-to-analog converter (CDAC) coupled to a first input of the comparator and, in a first phase, to a sensor cell. The CDC further includes a second CDAC coupled to a second input of the comparator and, in a second phase, to the sensor cell. The front-end circuitry provides a digital output. The digital output is proportional to a sensor capacitance of the sensor cell.

19 Claims, 10 Drawing Sheets

NANO-POWER ARCHITECTURE ENHANCEMENTS

TECHNICAL FIELD

The present disclosure generally relates to sensing systems, particularly capacitance-sensing systems configurable to measure capacitance or convert capacitance to digital values representative of the capacitance.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs, and other similar mechanical user interface controls. The use of a capacitive sense element eliminates complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Arrays of capacitive sense elements work by measuring the capacitance of a capacitive sense element, and looking for a delta (change) in capacitance indicating a touch or presence of a conductive object. When a conductive object (e.g., a finger, hand, or other objects) comes into contact with or close proximity to a capacitive sense element, the capacitance changes, and the conductive object is detected. An electrical circuit can measure the capacitance changes of the capacitive touch sense elements. The electrical circuit converts the measured capacitances of the capacitive sense elements into digital values.

There are two typical types of capacitance: 1) mutual capacitance where the capacitance-sensing circuit is coupled to both electrodes and a drive/receive configuration to measure the capacitance between the electrodes; 2) self-capacitance, where the capacitance-sensing circuit is coupled to a single electrode of the capacitor where the second electrode is tied to a direct current (DC) voltage level or is parasitically coupled to Earth Ground. A touch panel has a distributed load of the capacitance of both types 1) and 2), and some touch solutions sense both capacitances either uniquely or in hybrid form with its various sense modes.

DETAILED DESCRIPTION

Sensing device requirements for buttons need to be robust and high performing, since all portable electronics need power buttons to power the device on or off to preserve power when the device is not in use, reset the device, and so forth. Consumer and other electronic devices require robust power buttons that operate at low power levels (e.g., on the order of nano-Watts). Some capacitance-sensing technologies require two sensors for differential operation. Because of this, noise is integrated and sampled onto the capacitors during scanning, which can lead to increased susceptibility to noise at conversion clock intervals and increased spectral emissions at conversion clock multiples. Other capacitance-sensing technologies only require one sensor for single-ended operation, but such technologies may not offer sufficient immunity from supply noise, and may be susceptible to sampled noise on the sensor capacitor.

Described herein are various embodiments of apparatuses and methods for pseudo-differential sensing methods requiring only one sensor. Aspects of the present disclosure provide a half-wave sense method with good supply rejection and tunable sensitivity. Aspects of the present disclosure provide for auto-zero refresh between clock cycles to removed sampled noise. Aspects of the present disclosure provide a method to implement spread-spectrum asynchronous clocking to reduce electromagnetic susceptibility and emissions. Aspects of the present disclosure provide a method of water rejection using a power-cycled shield buffer.

One capacitance-to-digital converter described herein includes front-end circuitry including a comparator, a first capacitive digital-to-analog converter (CDAC), and a second CDAC. The first CDAC is coupled to a first input of the comparator, and the second CDAC is coupled to a second input of the comparator. In a first phase, the first CDAC is coupled to a sensor cell of the CDC. In a second phase, the second CDAC is coupled to the sensor cell of the CDC.

Figure 1:
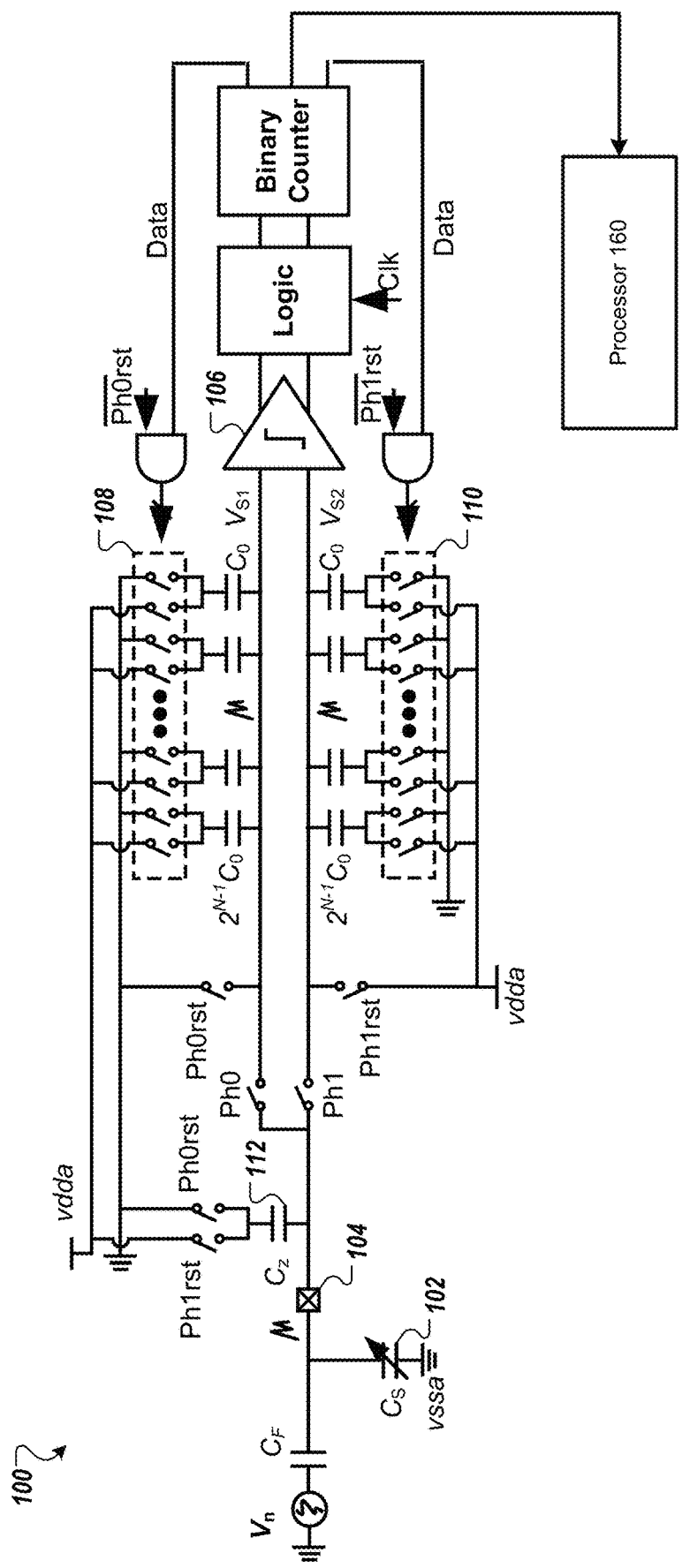
FIG. 1 is a schematic diagram of a pseudo-differential capacitance-to-digital converter (CDC) for use in power buttons according to one embodiment.

FIG. 1 is a schematic diagram of a pseudo-differential capacitance-to-digital converter (CDC) 100 for use in power buttons according to one embodiment. CDC 100 includes a sensor cell 102 with sensor capacitance $C_s$. Sensor cell 102 may be coupled to a terminal 104. Terminal 104 may be coupled to a first input of a comparator 106 during a first phase, Ph0, and a second input of comparator 106 during a second phase, Ph1. The phases may be clocked by a non-overlapping clock which causes switch Ph0 to be closed during the Ph0 phase and switch Ph1 to be closed during the Ph1 phase. The first phase and the second phase, as well as the non-overlapping clock, can be generated by logic (e.g., logic circuitry), which is part of a front-end circuitry including at least the comparator, the logic circuitry, and a counter. The logic may generate a first phase signal and a second phase signal (signals Ph0 and Ph1 corresponding to waveforms 301 and 303 of FIG. 3) corresponding to the first phase and the second phase. This allows sensor cell 102 to be sampled twice during each clock cycle, allowing CDC 100 to act as a pseudo-differential CDC operating with a full-wave scheme. As will be described in further detail below, CDC 100 may allow common-mode (VDDA) noise rejection and finger-injected noise rejection for capacitive power buttons and/or other capacitive applications.

A first capacitance digital-to-analog converter (CDAC) 108 and a second CDAC 110 may be coupled to the first and second inputs of comparator 106. First CDAC 108 may be selectively coupled to sensor cell 102 based on the first phase signal, while second CDAC 110 may be selectively coupled to sensor cell 102 based on the second phase signal. CDC 100 may be balanced (e.g., in a steady-state mode) when voltages $V_{s1}$ and $V_{s2}$ at the first and second inputs of comparator 106 are equal. The voltages $V_{s1}$ and $V_{s2}$ may be representative of the capacitance values of CDAC 108 and CDAC 110, respectively. Thus, the voltages $V_{s1}$ and $V_{s2}$ may be determined by setting the capacitances of CDAC 108 and CDAC 110. Logic may control CDACs 108 and 110 to set voltages $V_{s1}$ and $V_{s2}$ at the first and second inputs of comparator 106, respectively. The voltages can be expressed $$Vs1 = VDDA \cdot \frac{C_{DAC} + C_Z}{C_{DACmax} + C_z + Cs} \quad (1)$$

$$Vs2 = VDDA \cdot \left(1 - \frac{C_{DAC} + C_Z}{C_{DACmax} + C_z + Cs}\right) \quad (2)$$

In the above equations, VDDA is a supply voltage level, $C_{DAC}$ is the capacitance of CDACs 108 and 110, respectively, $C_s$ is the sensor capacitance, and $C_z$ is a zoom capacitance of a zoom capacitor 112. After each clock cycle, switches Ph0rst and Ph1rst may cause CDACs 108 and 110 to be reset to a ground potential and a supply voltage level VDDA respectively. Sensor cell 102 and zoom capacitor 112 may also be reset after each clock cycle. The logic circuitry may generate a first phase-reset signal and a second phase-reset signal (signals Ph0rst and Ph1rst corresponding to waveforms 305 and 307 of FIG. 3), which couples one or more of CDAC 108, sensor cell 102, or zoom capacitor 112 to the ground potential for a first duration of time within the first phase, responsive to the first phase-reset signal; and couples one or more of CDAC 110, sensor cell 102, or zoom capacitor 112 to the supply voltage for a second duration of time within the second phase, responsive to the second phase-reset signal. In some embodiments, the first duration of time and the second duration of time may be equal. In other embodiments, the first duration of time may be greater than or less than the second duration of time.

Zoom capacitor 112 may be a capacitor that is included and coupled to sensor cell 102 to select for a narrower range of the sensing signal strength. In particular, zoom capacitor 112 may act as an offset or compensation capacitor. Zoom capacitor 112 may allow for zooming in on a smaller range of capacitance values of interest to provide added sensitivity. In some embodiments, zoom capacitor 112 may allow for CDC 100 to work with sensor capacitances $C_s$ that are larger than capacitance ranges of CDACs 108 and or 110. For example, if the CDAC has a value of 2.5 pico Farads (pF), then without a zoom capacitor, a CDC would only measure a range of capacitances around 2.5 pF, and thus a capacitance $C_s$ of the sensor cell of 20 pF would be too large. A zoom capacitor of 17.5 pF may be added to cancel (e.g., remove) 17.5 pF from the 20 pF of the sensor cell, which allows the CDC to measure the remaining 2.5 pF. In other words, a zoom capacitor allows the CDC to support a wider range of sensor capacitance values. In some embodiments, a CDAC may have a range of approximately ten pico-Farads, while the desired signal may have a value on the order of tens or hundreds of femto-Farads, in which case, a zoom capacitor may be used to zoom in on the desired portion of the signal. For example, sensor cell 102 may operate at a first capacitance or a first range of capacitances, and zoom capacitor 112 may cause CDC 100 to operate at a second capacitance or a second range of capacitances. In some embodiments, the first range of capacitances may be between 0 to $C_s$ and the zoom capacitance may cause the second range of capacitances to between an offset capacitance value and $C_s$ (e.g., $C_z$ to $C_s$). In some embodiments, CDC 100 does not need to include a zoom capacitor. In other embodiments, CDC 100 can include more than one zoom capacitor. In some embodiments, zoom capacitor 112 may be implemented externally to CDC 100.

CDC 100 may include or be coupled to a digitizing circuit to provide a digital code (e.g., one or more digital values) to a processing device 160. The digital code may be linear with or proportional to the sensor capacitance $C_s$ (e.g., CDC 100 provides a ratio-metric measurement) and can be expressed $$Code = \frac{C_{DACmax} - C_z + Cs}{2 \cdot C_{lsb}} \quad (3)$$

In Equation (3), $C_{lsb}$ represents the capacitance step size of $C_{DAC}$ (e.g., lsb refers to "least significant bit").

Figure 2:
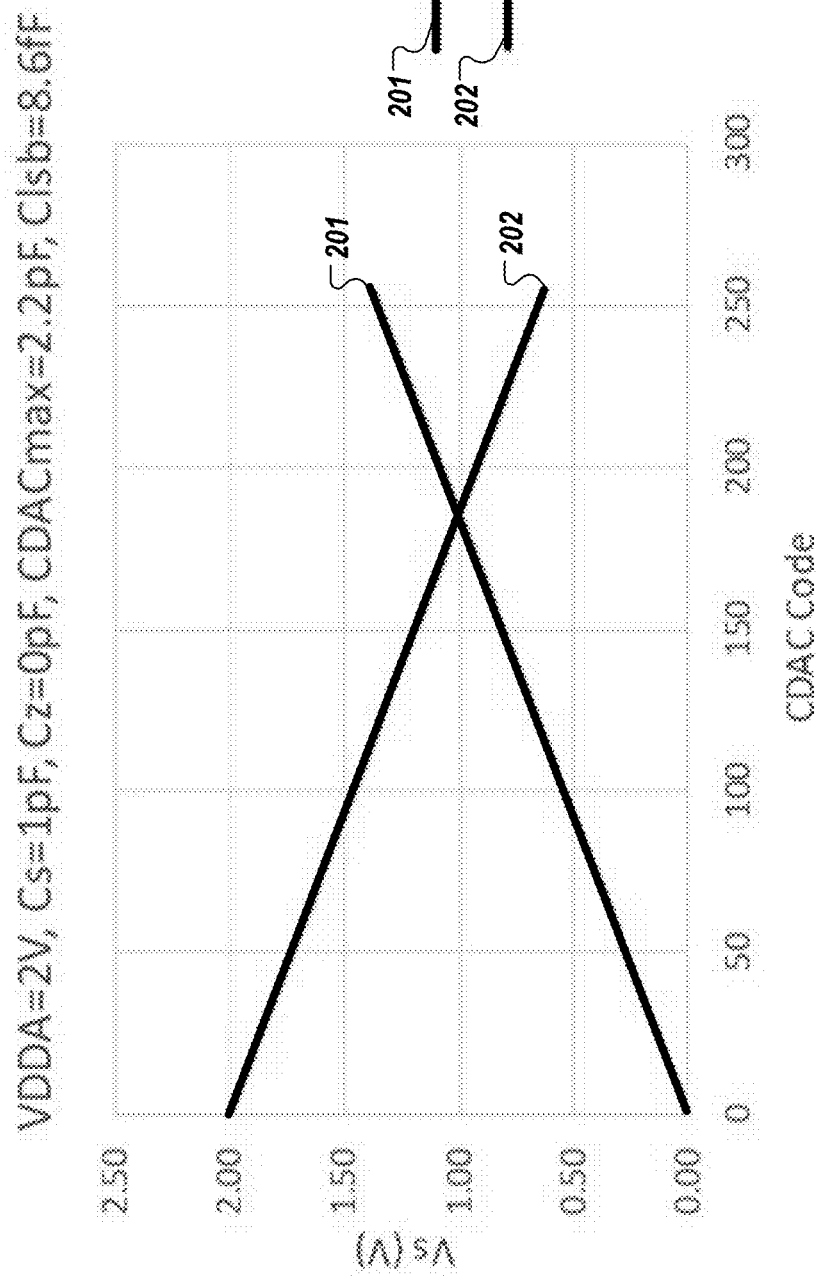
FIG. 2 is a graph illustrating voltage signals $V_{s1}$ and $V_{s2}$ at the first and second inputs of the comparator of FIG. 1 according to one embodiment.

FIG. 2 is a graph illustrating voltage signals $V_{s1}$ 201 and $V_{s2}$ 202 at the first and second inputs of comparator 106 of FIG. 1 according to one embodiment. The respective values of the voltage signals may be used by processing logic of CDC 100 in order to determine output digital code. In some embodiments, the processing logic changes the digital code to bring $V_{s1}$ and $V_{s2}$ together until comparator 106 trips. The value of the digital code at which comparator 106 trips may be used to calculate $C_s$.

Figure 3:
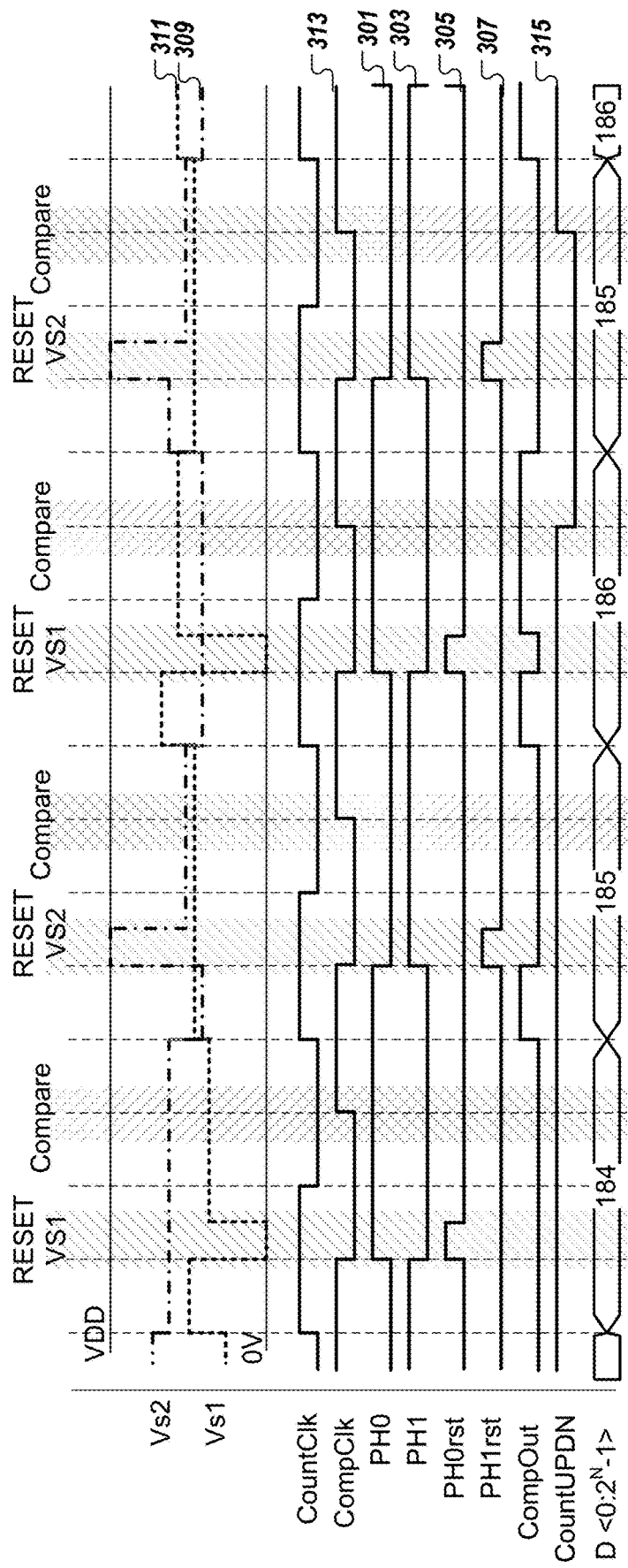
FIG. 3 is a waveform and timing diagram of the CDC of FIG. 1 according to one embodiment.

FIG. 3 is a waveform and timing diagram of CDC 100 of FIG. 1 according to one embodiment. Waveforms 301 and 303 indicate switching of switches Ph0 and Ph1. Waveform 301 may correspond to a first phase signal (e.g., generated by logic of the front-end circuitry of CDC 100), which selectively couples sensor cell 102 to the first input of comparator 106 to charge it to a first voltage level ($V_{s1}$) by setting a capacitance of CDAC 108 to a first capacitance. Waveform 303 may correspond to a second phase signal (e.g., generated by logic of the front-end circuitry of CDC 100), which selectively couples sensor cell 102 to the second input of comparator 106 to charge it to a second voltage level ($V_{s2}$) by setting a capacitance of CDAC 110 to a second capacitance.

Waveforms 305 and 307 indicate switching of switches Ph0rst and Ph1rst to reset CDACs 108 and 110. Waveform 305 may correspond to a first phase-reset signal (e.g., generated by logic of the front-end circuitry of CDC 100), which may cause first CDC 108, sensor cell 102, and zoom capacitor 112 to be selectively coupled to the ground potential for a first duration of time within the first phase. Waveform 207 may correspond to a second phase-reset signal (e.g., generated by logic of the front-end circuitry of CDC 100), which may cause second CDC 108, sensor cell 102, and zoom capacitor 112 to be selectively coupled to the supply voltage for a second duration of time within the second phase Waveforms 309 and 311 are example values of voltages at the first and second inputs of comparator 106. Waveforms 309 and 311 illustrate the resetting of CDACs 108 and 110 at each clock cycle.

Sensor cell 102 and zoom capacitor 112 may be alternatingly connected to CDACs 108 and 110 during every second clock (Clk) period. In other words, during the first phase Ph0, sensor cell 102 and zoom capacitor 112 may be connected to CDAC 108, while during the second phase Ph1, sensor cell 102 and zoom capacitor 112 may be connected to CDAC 110.

When sensor cell 102 and zoom capacitor 112 are disconnected from either CDAC, the voltage on that particular CDAC (and thus the voltage at the corresponding input of comparator 106) remains constant. When sensor cell 102 and zoom capacitor 112 are connected to a given CDAC, that particular CDAC as well as sensor cell 102 and zoom capacitor 112 may be reset to initialize the voltage of the CDAC to the correct voltage. This does not affect the operation of CDC 100 since the voltage on the inputs of comparator 106 are only compared during a positive edge (+ve) of a CompClk signal 313 to update a CountUPDN signal 315. A clock signal, CompClk signal 313, generated by a clock generator circuit may be a control signal that when received by comparator 106, causes comparator 106 to compare the first voltage level Vs1 and the second voltage level Vs2 based on the control signal. The first voltage level may represent a capacitance of CDAC 108, and the second voltage level may be representative of a capacitance of CDAC 110. It is worth noting that if CDAC 108 and CDAC 110 are incremented individually, the resolution of CDC 100 may be increased (e.g., by 1-bit).

Figure 4:
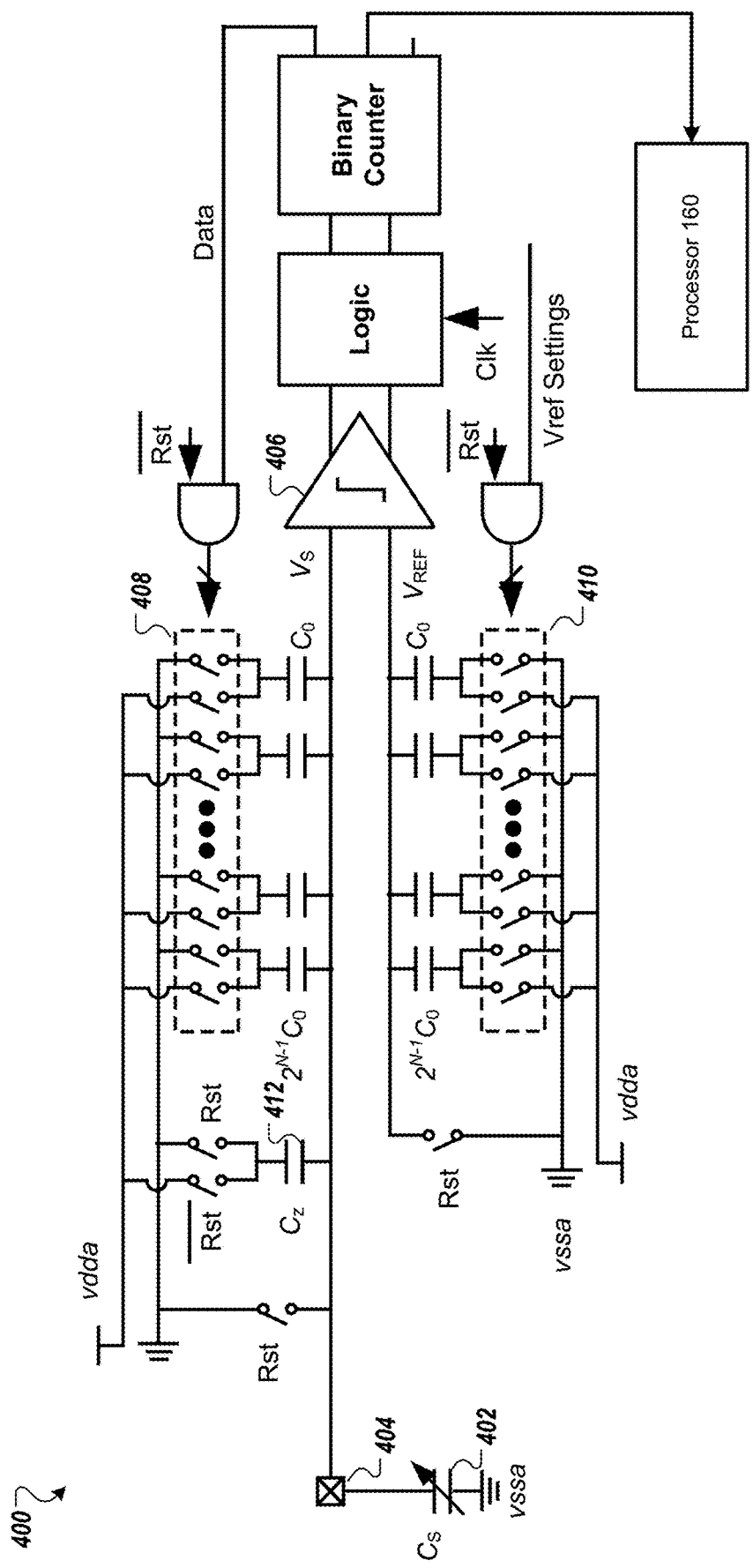
FIG. 4 is a schematic diagram of a single-ended CDC for use in power buttons according to one embodiment.

FIG. 4 is a schematic diagram of a single-ended CDC 400 for use in power buttons according to one embodiment. CDC 400 includes a sensor cell 402 with sensor capacitance $C_s$. Sensor cell 402 may be coupled to a terminal 404. Terminal 404 may be coupled to a first input of a comparator 406.

A first CDAC 408 and a second CDAC 410 may be coupled to the first and second inputs of comparator 406. First CDAC 408 may be used to sample sensor cell 402, and second CDAC 410 may serve as a reference (e.g., $V_{ref}$) at the second input of comparator 406. CDC 400 may operate in a half-wave scheme to output a digital code that is a ratiometric with regards to the supply voltage level VDDA. CDC 400 also includes a zoom capacitor 412, similar to zoom capacitor 112 of FIG. 1. After each clock cycle, reset (RST) switches may cause CDACs 408 and 410 to be reset to a supply voltage level VDDA or VSSA to remove sampled noise. Sensor cell 402 and zoom capacitor 412 may also be reset after each clock cycle. At the inputs of comparator 406, voltages can be expressed:

$$V_s = VDDA \cdot \frac{C_{DAC} + C_z}{C_{DACmax} + C_z + C_s} \quad (4)$$

$$V_{ref} = VDDA \cdot \frac{C_{DACR}}{C_{DACRmax}} = VDDA \cdot RCDAC_{ratio} \quad (5)$$

CDC 400 may include or be coupled to a digitizing circuit to provide a digital code (e.g., one or more digital values) to a processing device 160. The digital code may be ratiometric with respect to the supply voltage level (e.g., is independent of VDDA). The digital code may be expressed:

$$Code = \frac{RCDAC_{ratio} \cdot (C_{DACmax} + C_z + C_s) - C_z}{C_{lsb}} \quad (6)$$

In Equation 6, $$RCDAC_{ratio} = \frac{C_{DACR}}{C_{DACRmax}}.$$

By operating as a single-ended CDC with a half-wave scheme, CDC 400 can provide an output code that is linear with respect to the sensor capacitance $C_s$. Sensitivity of CDC 400 can be tuned by tuning CDAC 410 (e.g., the reference CDAC), which can provide a high rejection of VDDA noise.

Figure 5:
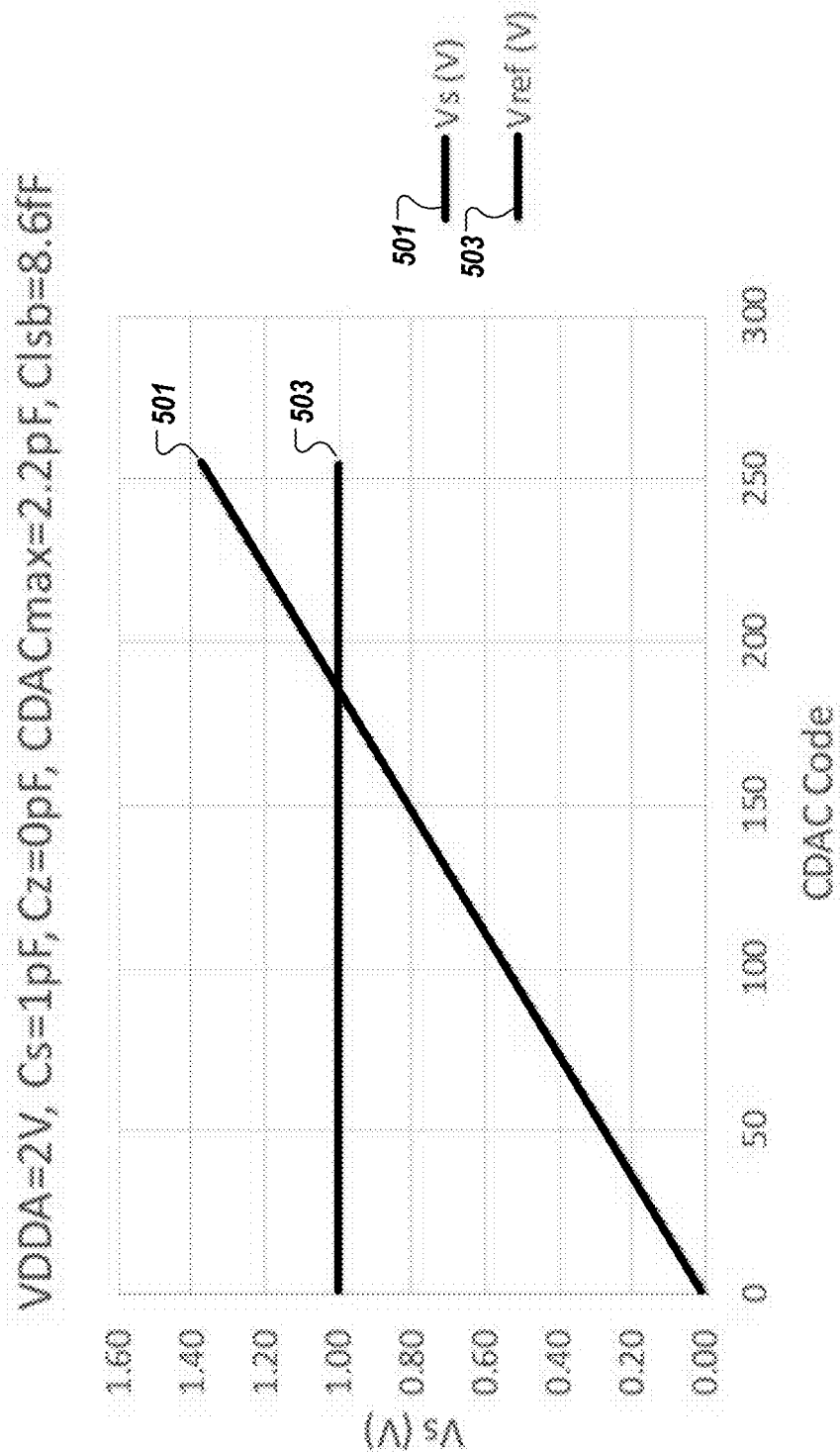
FIG. 5 is a graph illustrating voltage signals $V_s$ and $V_{ref}$ at the first and second inputs of the comparator of FIG. 4 according to one embodiment.

FIG. 5 is a graph illustrating voltage signals $V_s$ 501 and $V_{ref}$ 503 at the first and second inputs of comparator 406 of FIG. 4 according to one embodiment. The respective values of the voltage signals may be used by processing logic of CDC 400 in order to determine output digital code, as described with respect to FIG. 2.

Figure 6:
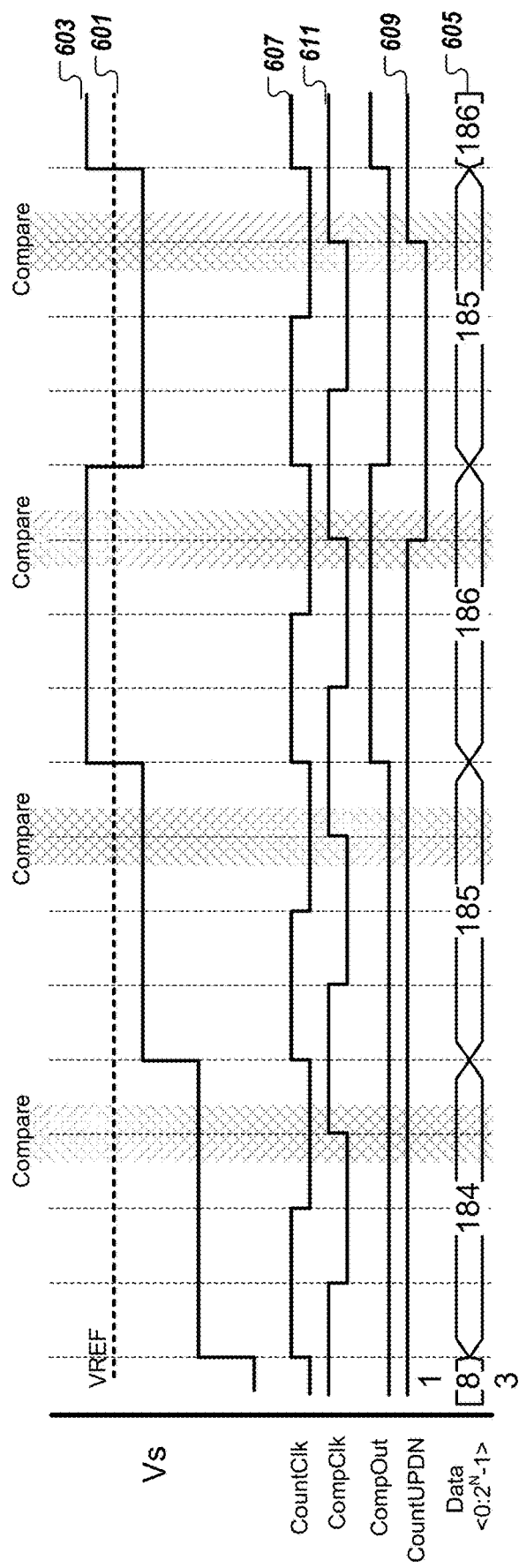
FIG. 6 is a waveform and timing diagram of the CDC of FIG. 4 operating in a half-wave mode without a periodic reset scheme according to one embodiment.

FIG. 6 is a waveform and timing diagram of CDC 400 of FIG. 4 operating in a half-wave mode without a periodic reset scheme according to one embodiment. Waveform 601 indicates the constant voltage $V_{ref}$ at the second input of comparator 406. Waveform 603 indicates the voltage $V_s$ at the first input of comparator 406. Comparator 406 may compare voltages (e.g., waveforms 601 and 603) to produce a DAC code 605. DAC code 605 may in incremented or decremented on a positive edge (e.g., a +ve edge) of a CountClk signal 607. Whether or not DAC code 605 is incremented or decremented depends on a CountUPDN signal 609.

Inputs of comparator 406 may be compared on a positive edge of a CompClk signal 611 to update CountUPDN signal 609 based on its polarity.

Figure 7:
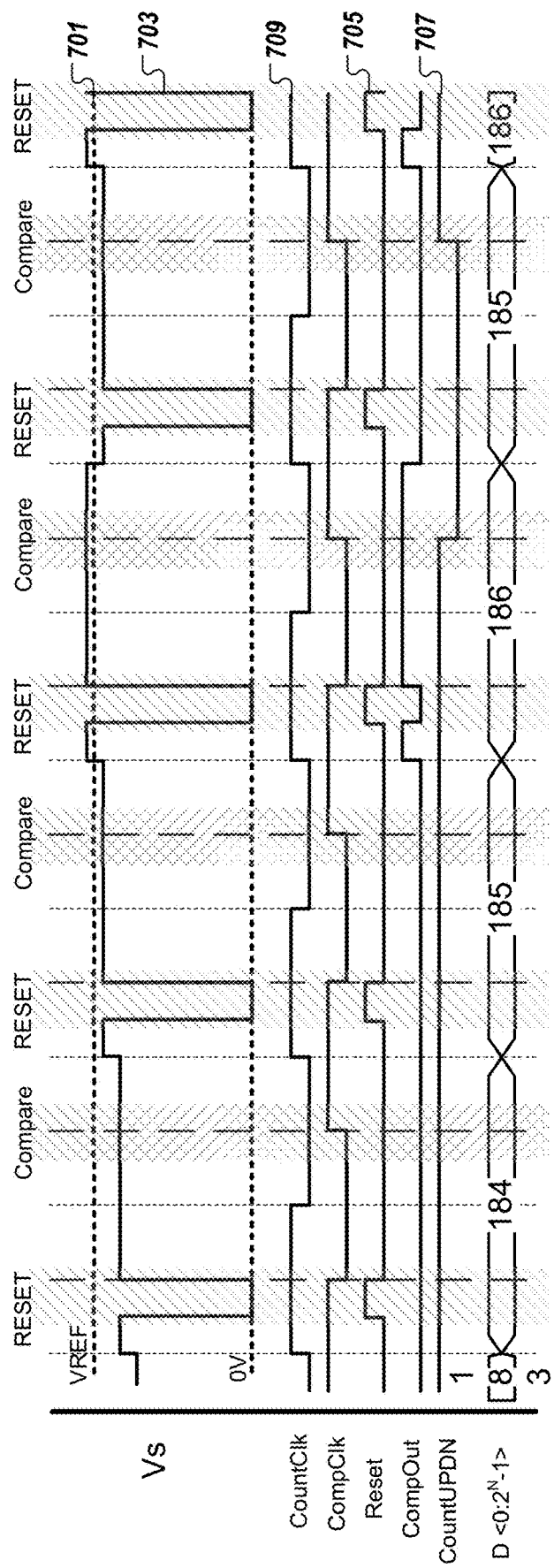
FIG. 7 is a waveform and timing diagram of the CDC of FIG. 4 operating in a half-wave mode with periodic reset according to one embodiment.

FIG. 7 is a waveform and timing diagram of CDC 400 of FIG. 4 operating in a half-wave mode with periodic reset according to one embodiment. Waveform 701 indicates the constant voltage $V_{ref}$ at the second input of comparator 406. Waveform 703 indicates the voltage $V_s$ at the first input of comparator 406. Comparator 406 may generate a HI or LO signal based on voltages (e.g., waveforms 701 and 703), which are received by logic and fed into a binary counter to produce the digital output code. The voltage at the first input of comparator 406 may be reset to a ground potential (e.g., 0 V) at each clock cycle as timed by waveform 705 (Reset). In addition, $C_z$, $C_s$, $C_{DAC}$ may be reset to VSSA at every clock period to remove sampling noise. CountUPDN 707 gets updated during the positive (+ve) edge of a CompClk signal 711, and so periodic reset does not affect the operation of CDC 400.

Figure 8:
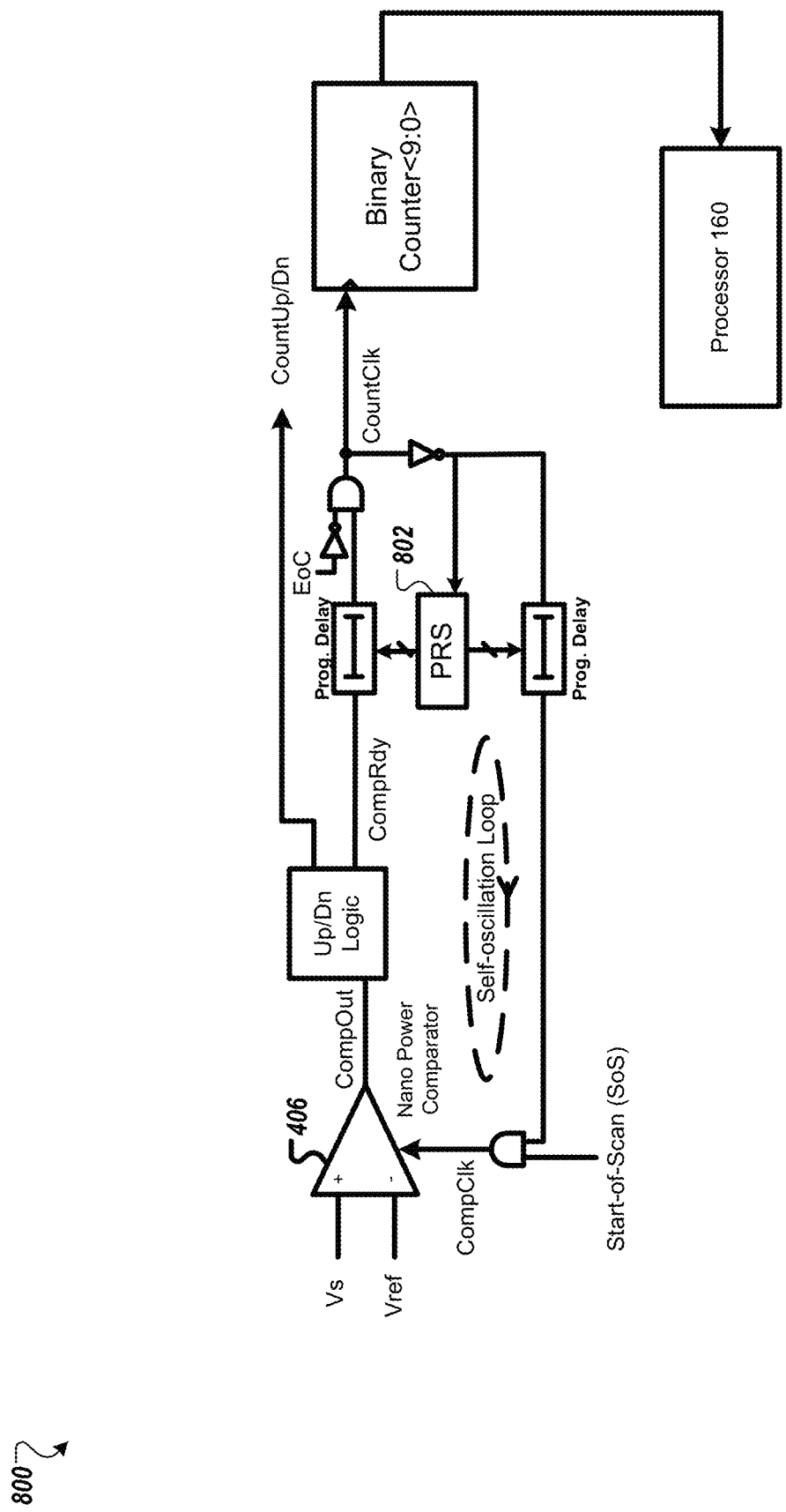
FIG. 8 is a schematic diagram of an asynchronous logic loop implemented at the output of the comparator of FIG. 4 according to one embodiment.

FIG. 8 is a schematic diagram of an asynchronous logic loop 800 implemented at the output of comparator 406 of FIG. 4 according to one embodiment. Asynchronous logic loop 800 may allow for incorporation of spread-spectrum clocking by including and modulating programmable delays. It is worth noting that spread-spectrum clocking may be applied to both single-ended and differential architectures. Logic loop 800 may include a delay circuit, such as sequence generator 802 (e.g., such as a pseudo-random sequence (PRS) generator) to generate a time delay that is applied to one or more clock signals, such as CompClk signals 313, 611, or 711. For example, the PRS generator may change the delays which changes the period of the clock signal (e.g., CompClk) that is used to drive the sensor, which allows for spreading of energy over many frequency bands, thus reducing electromagnetic emission and electromagnetic susceptibility. Sequence generator 802 can be used to create delays in the feedback loop, and by modulating and/or adjusting the delays, the frequency at which CDC 400 operators can be changed. In other words, sequence generator 802 may be used to change the period of the clocking of CDC 400, and modulate the output response.

In some embodiments, the generator may introduce pseudo-random programmable delays 804 and 806 in order to modulate clocking signal CompClk to comparator 406 as well as an output signal before it is received by counter 808.

Figure 9:
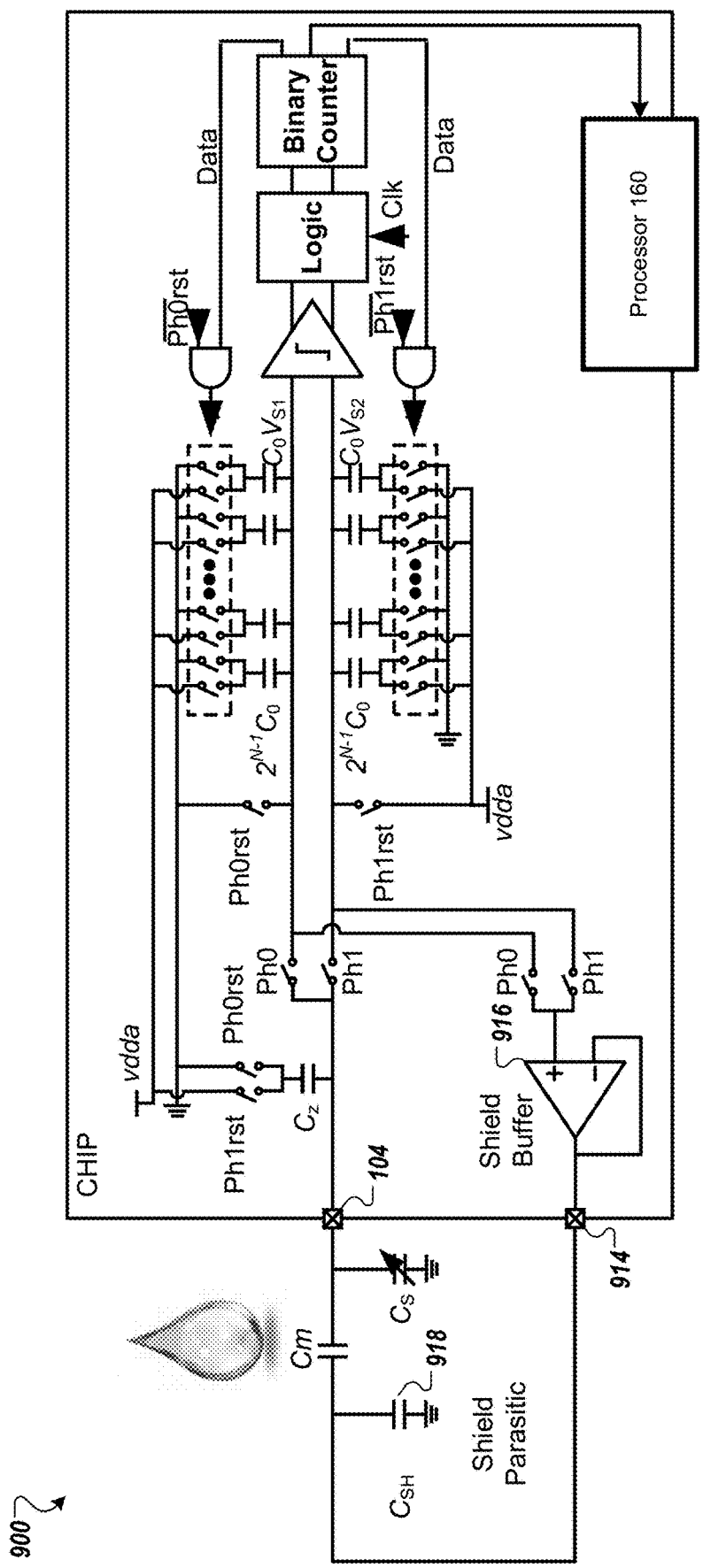
FIG. 9 is a schematic diagram of a pseudo-differential CDC for liquid shielding according to one embodiment.

FIG. 9 is a schematic diagram of a pseudo-differential CDC 900 for liquid shielding according to one embodiment. CDC 900 is the same as or similar to CDC 100 of FIG. 1, except where noted otherwise. CDC 900 includes a shield buffer 916 coupled to a terminal 914. CDC 900 includes a ground plane with a shield capacitance 918 that can be driven with a same signal that drives sensor cell 102. In other words, the ground plane and the sensor cell can be driven by a same signal. This may cause a mutual capacitance between the sensor cell and the ground plane to be effectively canceled out. If water or other liquid drop is present, it may generate an extra mutual capacitance Cm between sensor cell 102 and the ground plane of CDC 900, and effectively change the capacitance of sensor cell 102. By driving the ground plane (e.g., capacitor Csh) with the same driving signal used to drive sensor cell 102, the water or liquid that is present does not appear in the result of the measurement.

Figure 10:
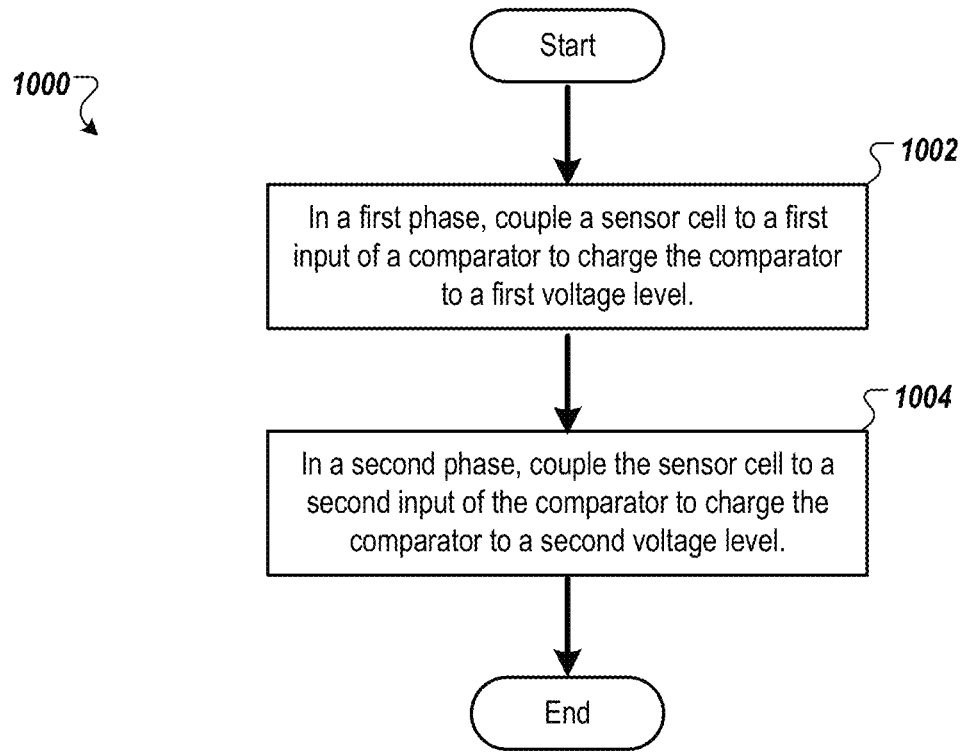
FIG. 10 is a flow diagram of one embodiment of a method 1000 of capacitance-to-digital code conversion according to one embodiment.

FIG. 10 is a flow diagram of one embodiment of a method 1000 of capacitance-to-digital code conversion according to one embodiment. In some embodiments, processing logic may perform the method 1000. The processing logic may include hardware, software, or any combination thereof. In one embodiment, processing device 160 of FIG. 1, FIG. 4, FIG. 8, or FIG. 9 may perform method 1000. In other embodiments, CDCs 100, 400, or 900 of FIG. 1, FIG. 4, or FIG. 9 may perform method 1000. Alternatively, other components may be used to perform some or all of the operations of method 1000.

At block 1002 in a first phase, the processing logic couples a sensor cell of a CDC to a first input of a comparator to charge the first input of the comparator to a first voltage level. A first CDAC is coupled to the first input of the comparator. At block 1004 in a second phase, the processing logic couples the sensor cell of a CDC to a second input of the comparator to charge the second input of the comparator to a second voltage level. A second CDAC is coupled to the second input of the comparator. In some embodiments, the first voltage level represents a first capacitance of the first CDAC and the second voltage level represents a second capacitance of the second CDAC. In some embodiments, the first voltage level represents a first capacitance which is a sum of a capacitance of the first CDAC, a sensor capacitance, and a zoom capacitance, while the second voltage level represents a second capacitance which is a sum of a capacitance of the second CDAC and the zoom capacitance. In further embodiments, the processing logic provides a digital output proportional to the sensor cell's sensor capacitance.

In further embodiments, in the first phase, the processing logic couples the first CDAC to a ground potential for a first duration of time within the first phase. In the second phase, the processing logic couples the second CDAC to a supply voltage for a second duration of time within the second phase.

In further embodiments, the processing logic, in the first duration of time, couples the sensor cell to the ground potential and couples the sensor cell to the supply voltage in the second duration of time.

In further embodiments, the processing logic couples a zoom capacitor to the ground potential in the first duration of time. The processing logic couples the zoom capacitor to the supply voltage in the second duration of time. The zoom capacitor is coupled to the sensor cell, which operates within a first capacitance range, and the zoom capacitor causes an offset of the first range of capacitances. In other words, the zoom capacitor may causes the sensor cell to operate within a second range of capacitances. The second range of capacitances may be narrower than the first range of capacitances.

In further embodiments, the processing logic generates a control signal to cause the comparator to compare the first voltage level and the second voltage level based on the control signal. The processing logic generates a delay added to the control signal. The delay modulates the digital output.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from the actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "applying," "coupling," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details, such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A capacitance-to-digital converter (CDC) comprising:
   front-end circuitry comprising a comparator;
   a first capacitive digital-to-analog converter (CDAC) coupled to a first input of the comparator and, in a first phase, to a sensor cell; and
   a second CDAC coupled to a second input of the comparator and, in a second phase, to the sensor cell, wherein the front-end circuitry is to provide a digital output, and wherein the digital output is proportional to a sensor capacitance of the sensor cell.

2. The CDC of claim 1, wherein the front-end circuitry comprises logic circuitry to generate a first phase signal corresponding to the first phase and a second phase signal corresponding to the second phase, wherein the CDC is configured to:
   in the first phase, selectively couple the sensor cell to the first input of the comparator to charge the first input of the comparator to a first voltage level by setting a capacitance of the first CDAC to a first capacitance based on the first phase signal; and
   in the second phase, selectively couple the sensor cell to the second input of the comparator to charge the second input of the comparator to a second voltage level by setting a capacitance of the second CDAC to a second capacitance based on the second phase signal.

3. The CDC of claim 2, wherein the front-end circuitry comprises logic circuitry comprising:
   a clock generator circuit to generate a clock signal, and wherein the comparator receives the clock signal and compare the first voltage level and the second voltage level based on the clock signal; and
   a delay circuit to generate a time delay applied to the clock signal.

4. The CDC of claim 3, wherein the delay circuit is a pseudo-random sequence (PRS) generator to delay the clock signal.

5. The CDC of claim 2, wherein the front-end circuitry comprises logic circuitry to generate a first phase-reset signal based on the first phase signal and a second phase-reset signal, wherein the CDC is configured to:
   in the first phase, couple the first CDAC to a ground potential for a first duration of time within the first phase responsive to the first phase-reset signal; and
   in the second phase, couple the second CDAC to a supply voltage for a second duration of time within the second phase responsive to the second phase-reset signal.

6. The CDC of claim 5, wherein the CDC is further configured to:
   in the first duration of time, couple the sensor cell to the ground potential; and
   in the second duration of time, couple the sensor cell to the supply voltage.

7. The CDC of claim 5, further comprising a capacitor coupled to the sensor cell and the first CDAC, wherein the first CDAC operates within a first range of capacitances, and the capacitor causes an offset of the first range of capacitances.

8. The CDC of claim 7, wherein the CDC is further configured to:
in the first duration of time, couple the capacitor to the ground potential; and
in the second duration of time, couple the capacitor to the supply voltage.

9. The CDC of claim 1, further comprising a ground plane, wherein the sensor cell and the ground plane are driven by a same signal.

10. A method comprising:
generating a first phase signal corresponding to a first phase;
generating a second phase signal corresponding to a second phase;
in the first phase, selectively coupling a sensor cell of a capacitance-to-digital converter (CDC) to a first input of a comparator to charge the first input of the comparator to a first voltage level by setting a capacitance of a first capacitive digital-to-analog converter (CDAC) to a first capacitance based on the first phase signal;
in a second phase, selectively coupling the sensor cell to a second input of the comparator to charge the second input of the comparator to a second voltage level by setting a capacitance of a second CDAC based on the second phase signal, wherein the first CDAC and the second CDAC are coupled to the first and second input of the comparator, respectively; and
providing a digital output, wherein the digital output is proportional to a sensor capacitance of the sensor cell.

11. The method of claim 10, further comprising:
generating a first phase-reset signal and a second phase-reset signal;
in the first phase, coupling the first CDAC to a ground potential for a first duration of time within the first phase responsive to the first phase-reset signal; and
in the second phase, coupling the second CDAC to a supply voltage for a second duration of time within the second phase responsive to the second phase-reset signal.

12. The method of claim 10, further comprising:
in the first duration of time, coupling the sensor cell to the ground potential; and
in the second duration of time, coupling the sensor cell to the supply voltage.

13. The method of claim 12, further comprising:
in the first duration of time, coupling a zoom capacitor to the ground potential; and
in the second duration of time, coupling the zoom capacitor to the supply voltage, wherein the first CDAC operates within a first range of capacitances, and the zoom capacitor causes an offset of the first range of capacitances.

14. The method of claim 10, further comprising providing, by front-end circuitry of the CDC, a digital output that is proportional to a sensor capacitance of the sensor cell.

15. The method of claim 10, further comprising:
generating a control signal to cause the comparator to compare the first voltage level and the second voltage level based on the control signal; and
generating a delay added to the control signal.

16. A capacitive power button comprising:
a sensor cell;
front-end circuitry comprising a comparator and logic circuitry;
a first capacitive digital-to-analog converter (CDAC) coupled to a first input of the comparator and to the sensor cell;
a second CDAC coupled to a second input of the comparator and to the sensor cell, wherein the front-end circuitry is to provide a digital output, and wherein the digital output is proportional to a sensor capacitance of the sensor cell; and
a processing device.

17. The capacitive power button of claim 16, wherein the logic circuitry to generate a first phase and a second phase, wherein the processing device is configured to:
in the first phase, couple the sensor cell to the first input of the comparator to charge the first input of the comparator to a first voltage level, the first voltage level being representative of a first capacitance of the first CDAC; and
in the second phase, couple the sensor cell to the second input of the comparator to charge the second input of the comparator to a second voltage level, the second voltage level being representative of a second capacitance of the second CDAC.

18. The capacitive power button of claim 17, wherein the processing device is further configured to:
in the first phase, couple the first CDAC to a ground potential for a first duration of time within the first phase; and
in the second phase, couple the second CDAC to a supply voltage for a second duration of time within the second phase.

19. The capacitive power button of claim 16, further comprising a ground plane, wherein the wherein the sensor cell is driven by a driving signal, and the ground plane is driven by the driving signal.

* * * * *